United States Patent
Liu et al.

(10) Patent No.: US 11,967,652 B2
(45) Date of Patent: Apr. 23, 2024

(54) SENSOR PACKAGE STRUCTURE HAVING SOLDER MASK FRAME

(71) Applicant: TONG HSING ELECTRONIC INDUSTRIES, LTD., Taipei (TW)

(72) Inventors: Fu-Chou Liu, Hsin-Chu County (TW); Jui-Hung Hsu, Hsin-Chu County (TW); Yu-Chiang Peng, Hsin-Chu County (TW); Chien-Chen Lee, Hsin-Chu County (TW); Ya-Han Chang, Hsin-Chu County (TW); Li-Chun Hung, Hsin-Chu County (TW)

(73) Assignee: TONG HSING ELECTRONIC INDUSTRIES, LTD., Taipei (TW)

(*) Notice: Subject to any disclaimer, the term of this patent is extended or adjusted under 35 U.S.C. 154(b) by 0 days.

(21) Appl. No.: 18/110,610

(22) Filed: Feb. 16, 2023

(65) Prior Publication Data
US 2023/0207708 A1 Jun. 29, 2023

Related U.S. Application Data

(62) Division of application No. 16/920,492, filed on Jul. 3, 2020, now abandoned.

(30) Foreign Application Priority Data

Mar. 26, 2020 (TW) .................. 109110135

(51) Int. Cl.
H01L 31/02 (2006.01)
H01L 31/0203 (2014.01)

(52) U.S. Cl.
CPC .... *H01L 31/02002* (2013.01); *H01L 31/0203* (2013.01)

(58) Field of Classification Search
CPC .......... H01L 31/02002; H01L 31/0203; H01L 27/14618
USPC ........................................ 257/738
See application file for complete search history.

(56) References Cited

U.S. PATENT DOCUMENTS

| 6,384,472 | B1* | 5/2002 | Huang ............... H01L 21/50 257/730 |
| 11,393,859 | B2 | 7/2022 | Jo et al. |
| 2006/0023108 | A1* | 2/2006 | Watanabe ......... H01L 27/14627 348/335 |
| 2007/0190747 | A1* | 8/2007 | Humpston .......... B81C 1/00285 438/460 |
| 2016/0260761 | A1* | 9/2016 | Jun ................... H01L 27/14636 |

(Continued)

*Primary Examiner* — Duy T Nguyen
(74) *Attorney, Agent, or Firm* — Li & Cai Intellectual Property (USA) Office

(57) ABSTRACT

A sensor package structure includes a substrate, a sensor chip and a ring-shaped solder mask frame those are disposed on the substrate, a ring-shaped support disposed on a top side of the annular solder mask frame, and a light permeable member that is disposed on the ring-shaped support. The sensor chip is electrically coupled to the substrate. A top surface of the sensor chip has a sensing region, and the sensing region is spaced apart from an outer lateral side of the sensor chip by a distance less than 300 μm. The ring-shaped solder mask frame surrounds and contacts the outer lateral side of the sensor chip. The light permeable member, the ring-shaped support, and the sensor chip jointly define an enclosed space.

14 Claims, 8 Drawing Sheets

(56) References Cited

U.S. PATENT DOCUMENTS

2017/0365632 A1* 12/2017 Tu ..................... H01L 31/0203
2018/0012919 A1*  1/2018 Tu ..................... H01L 27/14618
2018/0211989 A1*  7/2018 Hogyoku ............. H01L 24/18
2019/0057992 A1*  2/2019 Chen ................. H01L 27/14636

* cited by examiner

SENSOR PACKAGE STRUCTURE HAVING SOLDER MASK FRAME

CROSS-REFERENCE TO RELATED PATENT APPLICATION

This application claims the benefit of priority to Taiwan Patent Application No. 109110135, filed on Mar. 26, 2020. The entire content of the above identified application is incorporated herein by reference.

The present application is a divisional application of co-pending application Ser. No. 16/920,492, filed on Jul. 3, 2020 and entitled "SENSOR PACKAGE STRUCTURE," now abandoned. Moreover, this divisional application rejoins claims based on Subspecies of FIG. 2, according to the Restriction Requirement dated Mar. 9, 2022, augmented with new claims supported by original specification.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a package structure, and more particularly to a sensor package structure.

BACKGROUND OF THE DISCLOSURE

A conventional sensor package structure includes a substrate, a sensor chip disposed on the substrate, and a package body that surrounds and is connected to a peripheral side of the sensor chip. As the size of the sensor chip becomes smaller, a sensing region of the sensor chip shall be more closer to lateral sides of the sensor chip, and therefore the sensing region is more easily contaminated by the melted or fluid package body (or a sealing gel) during the manufacturing process of the conventional package structure, affecting the production yield or causing product failure.

SUMMARY OF THE DISCLOSURE

In response to the above-referenced technical inadequacies, the present disclosure provides a sensor package structure to effectively improve on the issues associated with conventional sensor package structures.

In one aspect, the present disclosure provides a sensor package structure, which includes a substrate, a sensor chip, a ring-shaped solder mask frame, a ring-shaped support, and a light permeable member. The substrate has a first board surface and a second board surface that is opposite to the first board surface. The sensor chip is disposed on the first board surface and is electrically coupled to the substrate. A top surface of the sensor chip includes a sensing region, and the sensing region is spaced apart from an outer lateral side of the sensor chip by a distance less than 300 μm. The ring-shaped solder mask frame is disposed on the first board surface of the substrate. The ring-shaped solder mask frame surrounds and contacts the outer lateral side of the sensor chip. The ring-shaped support is disposed on a top side of the ring-shaped solder mask frame. The light permeable member has a first surface and a second surface that is opposite to the first surface and that is disposed on the ring-shaped support. The second surface of the light permeable member, the ring-shaped support, and the sensor chip jointly define an enclosed space.

In one aspect, the present disclosure provides a sensor package structure, which includes a substrate, a sensor chip, a ring-shaped solder mask frame, and a light permeable member. The substrate has a first board surface and a second board surface that is opposite to the first board surface. The sensor chip is disposed on the first board surface and is electrically coupled to the substrate. A top surface of the sensor chip includes a sensing region, and the sensing region is spaced apart from an outer lateral side of the sensor chip by a distance less than 300 μm. The ring-shaped solder mask frame is disposed on the first board surface of the substrate. The ring-shaped solder mask frame surrounds and is spaced apart from the outer lateral side of the sensor chip. The light permeable member has a first surface and a second surface that is opposite to the first surface and that is disposed on the ring-shaped solder mask frame. The second surface of the light permeable member, the ring-shaped solder mask frame, and the sensor chip jointly define an enclosed space.

In summary, the sensor package structure of the present disclosure is provided with the ring-shaped solder mask frame that surrounds the outer lateral side of the sensor chip. Since the thickness and the shape of the ring-shaped solder mask frame can be effectively and precisely controlled for accommodating the sensor chip or other components, the sensing region of the sensor chip is prevented from being contaminated by the ring-shaped solder mask frame, which will further effectively increase yield rate and throughput of manufacturing of the sensor package structure.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

First Embodiment

Figure 1:
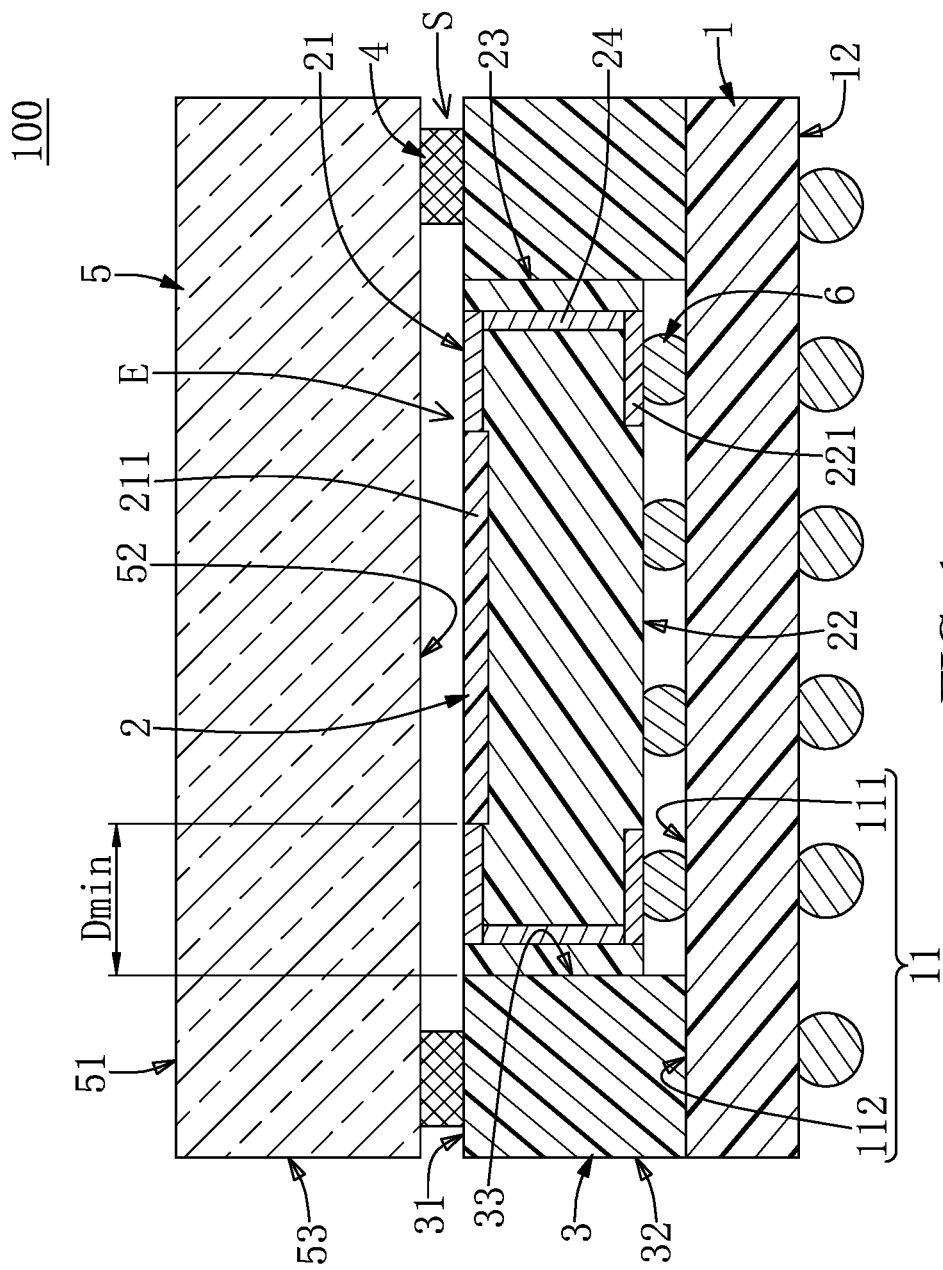
FIG. 1 is a cross-sectional view of a sensor package structure according to a first embodiment of the present disclosure.

Referring to FIG. 1, a first embodiment of the present disclosure provides a sensor package structure 100. The sensor package structure 100 includes a substrate 1, a sensor chip 2 disposed on the substrate 1 through a plurality of solder balls 6, a ring-shaped solder mask frame 3 disposed on the substrate 1, a ring-shaped support 4 disposed on the ring-shaped solder mask frame 3, and a light permeable member 5 that is disposed on the ring-shaped support 4. Herein, the sensor package structure 100 in the present embodiment is illustrated as including the above components, but the sensor package structure 100 can be modified according to design requirements.

It should be noted that in order to conveniently describe the sensor package structure 100 of the present embodiment, FIG. 1 is plotted as a cross-sectional view. It could be understood that some portions of the sensor package structure 100 not shown in FIG. 1 shall have corresponding structures. For example, FIG. 1 shows only four of the solder balls 6, but portions of the sensor package structure 100 not shown in FIG. 1 include other solder balls 6. The following paragraphs respectively recite the structure and interconnection of each component of the sensor package structure 100.

The substrate 1 in the present embodiment is in a rectangular shape, but the present disclosure is not limited thereto. The substrate 1 has a first board surface 11 and a second board surface 12 that is opposite to the first board surface 11. The substrate 1 has a chip bonding region 111 and a ring-shaped carrying region 112. The chip bonding region 111 is substantially arranged at the center of the first board surface 11, and the ring-shaped carrying region 112 is arranged on the first board surface 11 and outside of the chip bonding region 111 (or the sensor chip 2). In addition, the substrate 1 in the present embodiment can be provided with a plurality of soldering balls (not shown) disposed on the second board surface 12, and the sensor package structure 100 can be soldered onto an electronic component (not shown) through the soldering balls, thereby electrically coupling the sensor package structure 100 to the electronic component.

The sensor chip 2 in the present embodiment is an image sensor chip, but the present disclosure is not limited thereto. An outer surface of the sensor chip 2 includes a top surface 21, a bottom surface 22 opposite to the top surface 21, and an outer lateral side 23 that is connected to a peripheral edge of the top surface 21 and a peripheral edge of the bottom surface 22. The top surface 21 of the sensor chip 2 has a sensing region 211 substantially on a center portion thereof. The sensor chip 2 includes a plurality of internal contacts 221 arranged on the bottom surface 22. The sensing region 211 is spaced apart from the outer lateral side 23 of the sensor chip 2 by a distance Dmin which is less than 300 μm. The sensor chip 2 further includes a plurality of conducting paths 24 extending from the top surface 21 to the bottom surface 22. The conducting paths 24 are respectively connected to the internal contacts 221 and are electrically coupled to the sensing region 211.

Moreover, the sensor chip 2 is disposed on the first board surface 11 of the substrate 1, and is electrically coupled to the substrate 1. In the present embodiment, the bottom surface 22 of the sensor chip 2 is mounted to the chip-bonding region 111 of the substrate 1 through the solder balls 6 so as to be electrically coupled to the substrate 1. In other words, the internal contacts 221 of the sensor chip 2 are soldered onto the first board surface 11 of the substrate 1 through the solder balls 6.

The ring-shaped solder mask frame 3 is disposed on the carrying region 112 of the first board surface 11 of the substrate 1, the ring-shaped solder mask frame 3 surrounds and connects the outer lateral side 23 of the sensor chip 2. A top side 31 of the ring-shaped solder mask frame 3 is coplanar with the top surface 21 of the sensor chip 2, and an outer lateral side 32 of the ring-shaped solder mask frame 3 is flush with an outer lateral side of the substrate 1. In other words, the outer lateral side 23 of the sensor chip 2 in the present embodiment is entirely connected to the inner lateral side 33 of the ring-shaped solder mask frame 3, and the sensor chip 2 is embraced in the ring-shaped solder mask frame 3.

It is noted that the ring-shaped solder mask frame 3 can be formed in a punching manner, a photolithography manner, a printing manner, or a coating manner, the thickness and the shape of the ring-shaped solder mask frame 3 can be effectively and precisely controlled for accommodating the sensor chip 2 or other components. Accordingly, the sensing region 211 of the sensor chip 2 is prevented from being contaminated by the ring-shaped solder mask frame 3, thereby effectively further increasing yield rate and throughput of manufacturing of the sensor package structure 100.

The ring-shaped support 4 is disposed on the top side 31 of the ring-shaped solder mask frame 3, and the ring-shaped support 4 is arranged outside of the sensing region 211 and is not in contact with the top surface 21 of the sensor chip 2. In the present embodiment, the ring-shaped support 4 may be formed with glue or an adhesive, and the ring-shaped support 4 is disposed substantially on a center portion of the top side 31 of the ring-shaped solder mask frame 3, but the present disclosure is not limited thereto. For example, in other embodiments not shown in the present disclosure, the ring-shaped support 4 can be disposed on the entirety of the top side 31 of the ring-shaped solder mask frame 3.

The light permeable member 5 includes a first surface 51, a second surface 52 that is opposite to the first surface 51, and an outer lateral surface 53 that is connected to a peripheral edge of the first surface 51 and a peripheral edge of the second surface 52. Herein, the second surface 52 of the light permeable member 5 is disposed on the ring-shaped support 4 (i.e., the ring-shaped support 4 is sandwiched between the top side 31 of the ring-shaped solder mask frame 3 and the second surface 52 of the light permeable member 5), so that the second surface 52 of the light permeable member 5, the ring-shaped support 4, and the sensor chip 2 jointly define an enclosed space E.

In the present embodiment, along a horizontal direction shown in FIG. 1, an outer diameter of the light permeable member 5 is equal to that of the ring-shaped solder mask frame 3. In other words, the outer lateral surface 53 of the light permeable member 5 is coplanar with the outer lateral side 32 of the ring-shaped solder mask frame 3. Moreover, the outer diameter of the light permeable member 5 is slightly greater than that of the ring-shaped support 4, so that the top side 31 of the ring-shaped solder mask frame 3, an outer lateral side of the ring-shaped support 4, and the light permeable member 5 jointly define a ring-shaped slot S.

Second Embodiment

Figure 2:
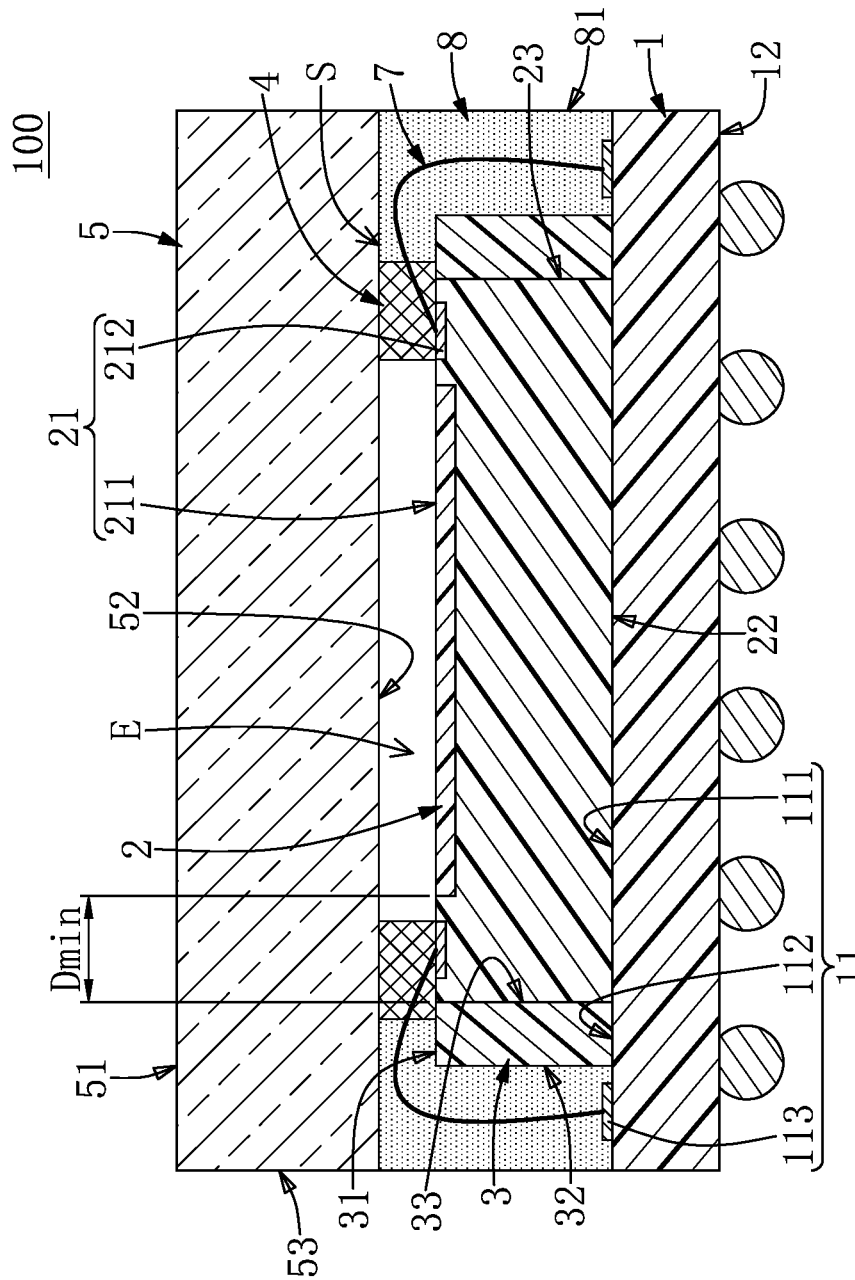
FIG. 2 is a cross-sectional view of a sensor package structure according to a second embodiment of the present disclosure.

Referring to FIG. 2, a second embodiment of the present disclosure is disclosed therein. The second embodiment is similar to the first embodiment, so descriptions for identical portions between the two embodiments shall not be repeated again, and the differences between the two embodiments shall be recited in the following.

In the present embodiment, the sensor package structure 100 includes a substrate 1, a sensor chip 2 disposed on the substrate 1, a ring-shaped solder mask frame 3 disposed on the substrate 1, a ring-shaped support 4 disposed on both the ring-shaped solder mask frame 3 and the sensor chip 2, a light permeable member 5 disposed on the ring-shaped support 4, a plurality of metal wires 7 electrically coupled to the substrate 1 and the sensor chip 2, and a package body 8 that is formed on the substrate 1.

The substrate 1 includes a plurality of first pads 113 arranged on the first board surface 11. The first pads 113 are located outside of the carrying region 112, and the first pads 113 of the present embodiment are arranged substantially in a ring-shape, but the present disclosure is not limited thereto. For example, in other embodiments not shown in the present disclosure, the first pads 113 can be arranged in two rows respectively located at two opposite sides of the chip-bonding region 111.

The sensor chip 2 includes a plurality of second pads 212 arranged on the top surface 21 and outside of the sensing region 211. The quantity and the positions of the second pads 212 of the sensor chip 2 in the present embodiment respectively correspond to those of the first pads 113 of the substrate 1. Moreover, terminals at one end of the metal wires 7 are respectively connected to the first pads 113, and terminals at the other end of the metal wires 7 are respectively connected to the second pads 212, so that the substrate 1 can be electrically coupled to the sensor chip 2 through the metal wires 7. In addition, the ring-shaped solder mask frame 3 is not in contact with any of the first pads 113.

The ring-shaped support 4 is dispensed on both the top side 31 of the ring-shaped solder mask frame 3 and the top surface 21 of the sensor chip 2, and the ring-shaped support 4 is arranged outside of the sensing region 211. In the present embodiment, the ring-shaped support 4 may be formed with glue or an adhesive, and a part of each of the metal wires 7 and the corresponding second pad 212 are embedded in the ring-shaped support 4.

The package body 8 is formed on the first board surface 11 of the substrate 1, and another part of each of the metal wires 7, which is exposed from the ring-shaped support 4, and the corresponding first pad 113 are embedded in the package body 8. An outer lateral side 81 of the package body 8 is coplanar with the outer lateral side of the substrate 1, and is also coplanar with the outer lateral surface 53 of the light permeable member 5. In other words, the sensor chip 2, the ring-shaped solder mask frame 3, and the ring-shaped support 4 are embedded in the package body 8, and the slot S is fully filled with the package body 8.

Third Embodiment

Figure 3:
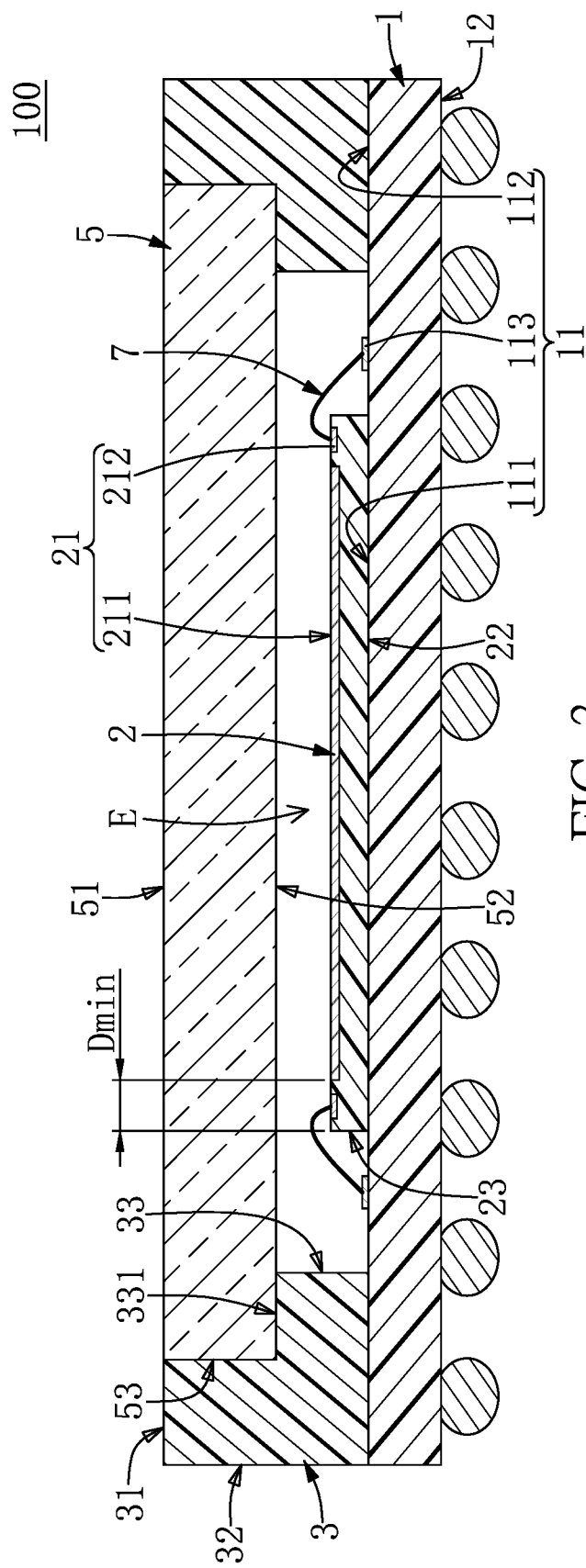
FIG. 3 is a cross-sectional view of a sensor package structure according to a third embodiment of the present disclosure.
Figure 4:
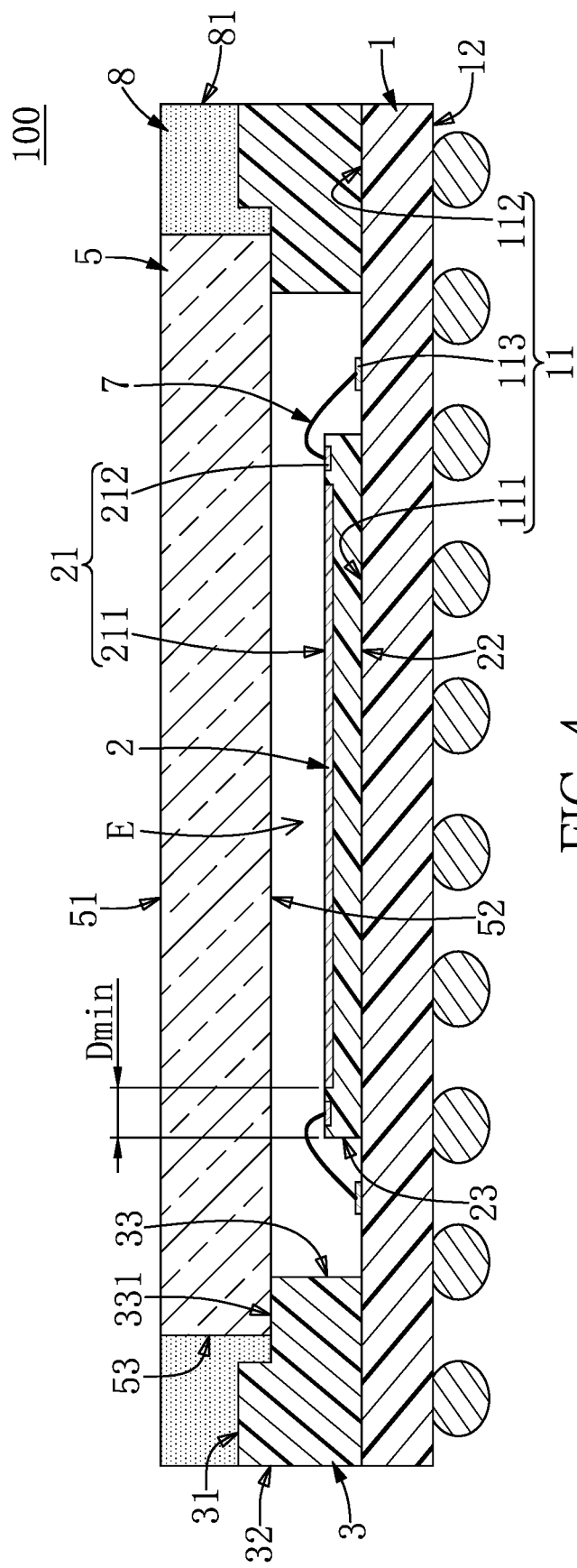
FIG. 4 is a cross-sectional view showing the sensor package structure in another configuration according to the third embodiment of the present disclosure.

Referring to FIG. 3 and FIG. 4, a third embodiment of the present disclosure is similar to the first and second embodiments of the present disclosure, so descriptions for identical portions among the embodiments will be not repeated again, and the differences between the first and second embodiments shall be recited in the following.

In the present embodiment, the ring-shaped solder mask frame 3 is disposed on the carrying region 112 of the first board surface 11 of the substrate 1. The ring-shaped solder mask frame 3 surrounds and is spaced apart from the outer lateral side 23 of the sensor chip 2. In other words, the sensor chip 2 and the metal wires 7 are arranged in a space enclosed by the ring-shaped solder mask frame 3. Moreover, the ring-shaped solder mask frame 3 in the present embodiment is integrally formed as a one-piece structure. The outer lateral side 32 of the ring-shaped solder mask frame 3 is coplanar with the outer lateral side of the substrate 1, and the inner lateral side 33 of the ring-shaped solder mask frame 3 is in a step shape and has a step surface 331.

The second surface 52 of the light permeable member 5 is disposed on the inner lateral side 33 of the ring-shaped solder mask frame 3, and the light permeable member 5 in the present embodiment is disposed on the step surface 331 of the ring-shaped solder mask frame 3. Moreover, the second surface 52 of the light permeable member 5, the ring-shaped solder mask frame 3, and the sensor chip 2 jointly define an enclosed space E. The first surface 51 of the light permeable member 5 is coplanar with the top side 31 of the ring-shaped solder mask frame 3, but the present disclosure is not limited thereto.

In another configuration as shown in FIG. 4, the sensor package structure 100 can further include a package body 8 formed on the top side 31 of the ring-shaped solder mask frame 3. Moreover, the package body 8 covers and is connected to the outer lateral surface 53 of the light permeable member 5, the outer lateral side 81 of the package body 8 is coplanar with the outer lateral side 32 of the ring-shaped solder mask frame 3, and the top side of the package body 8 is coplanar with the first surface 51 of the light permeable member 5.

Fourth Embodiment

Referring to FIG. 5 to FIG. 8, a fourth embodiment of the present disclosure is similar to the third embodiment of the present disclosure. So, descriptions for identical portions between the third and fourth embodiments of the present disclosure (e.g., the substrate 1, the sensor chip 2, and the light permeable member 5) will be repeated again, and the differences between the third embodiment and the fourth embodiment shall be recited in the following.

Figure 5:
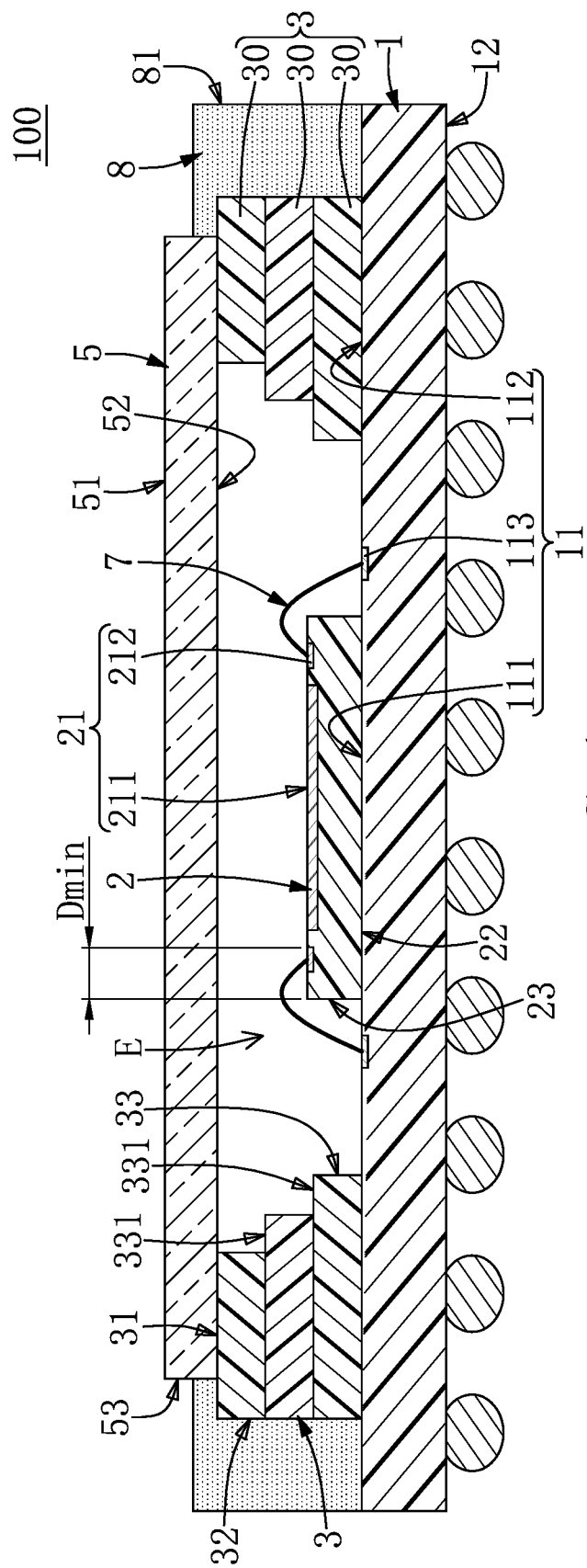
FIG. 5 is a cross-sectional view of a sensor package structure according to a fourth embodiment of the present disclosure.
Figure 6:
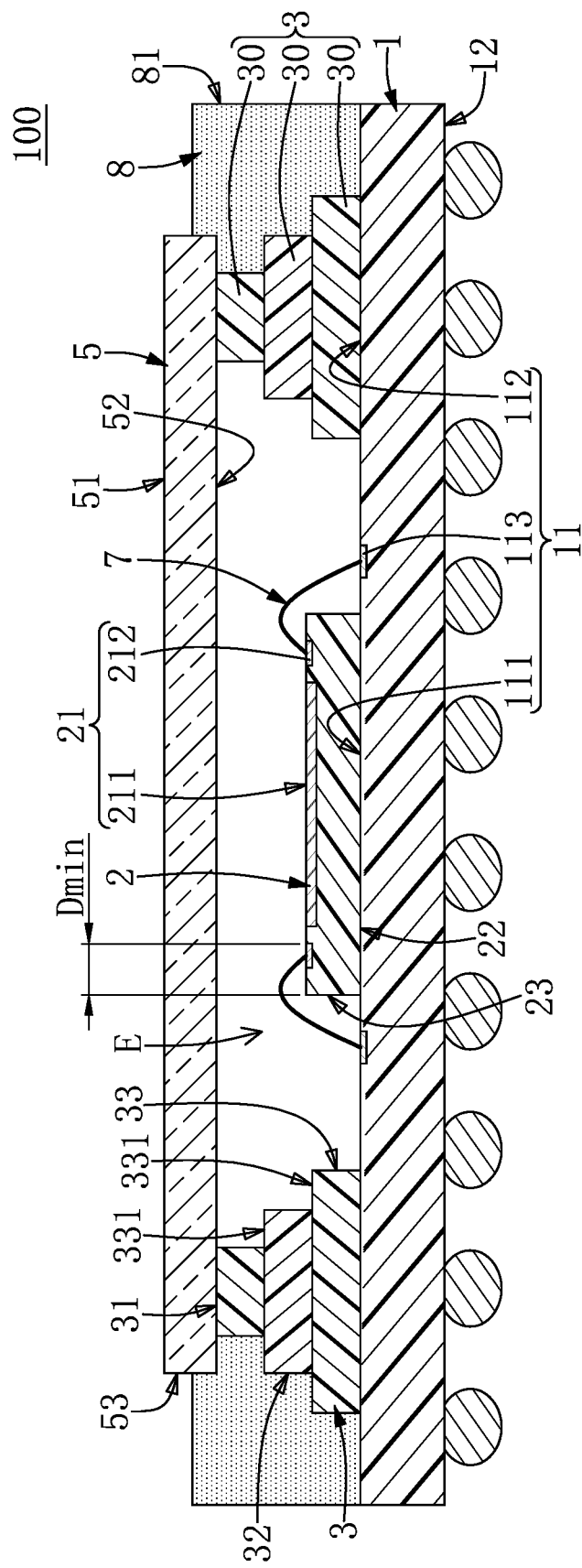
FIG. 6 is a cross-sectional view showing the sensor package structure in another configuration according to the fourth embodiment of the present disclosure.
Figure 7:
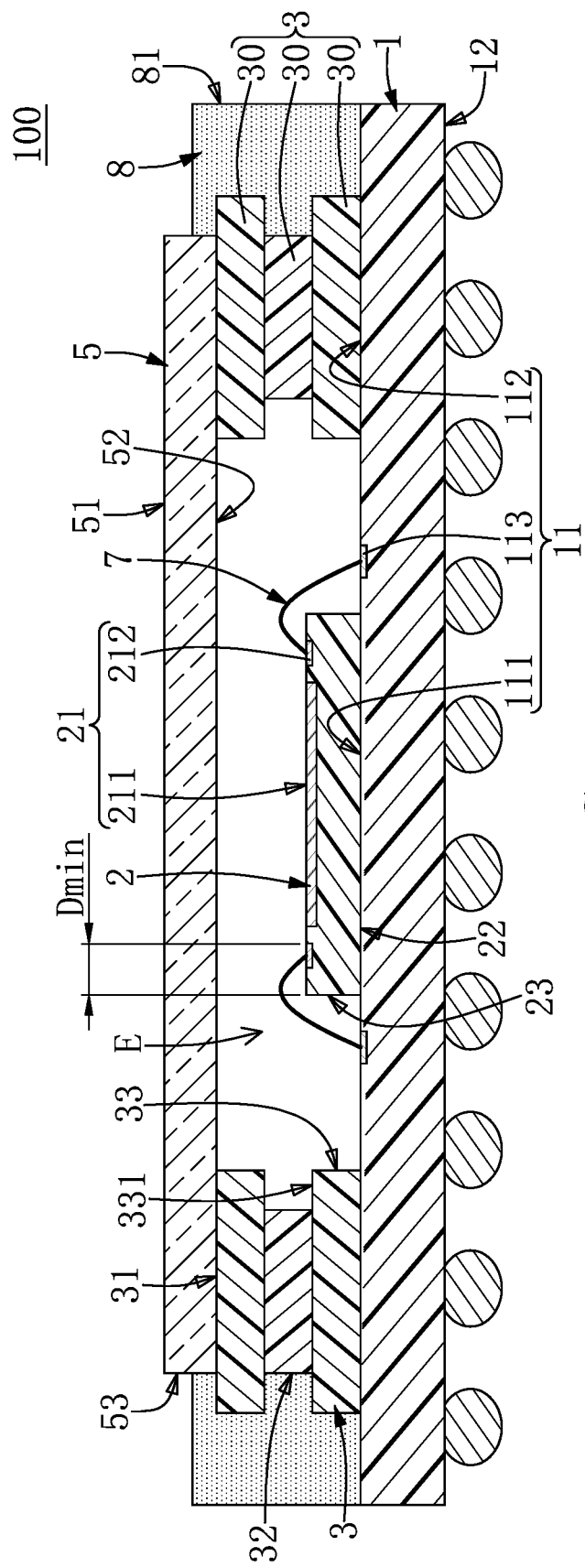
FIG. 7 is a cross-sectional view showing the sensor package structure in still another configuration according to the fourth embodiment of the present disclosure.

As shown in FIG. 5, the ring-shaped solder mask frame 3 in the present embodiment includes a plurality of solder mask layers 30 stacked and adhered together. Inner lateral sides of the solder mask layers 30 are not coplanar with each other. In other words, the inner lateral side 33 of the ring-shaped solder mask frame 3 is in a step shape and has a plurality of step surfaces 331. Moreover, outer lateral sides of the solder mask layers 30 are coplanar with each other, but the present disclosure is not limited thereto. For example, the arrangement of the solder mask layers 30 can be those as shown in FIG. 6 and FIG. 7, the outer lateral sides of the solder mask layers 30 are not coplanar with each other.

Figure 8:
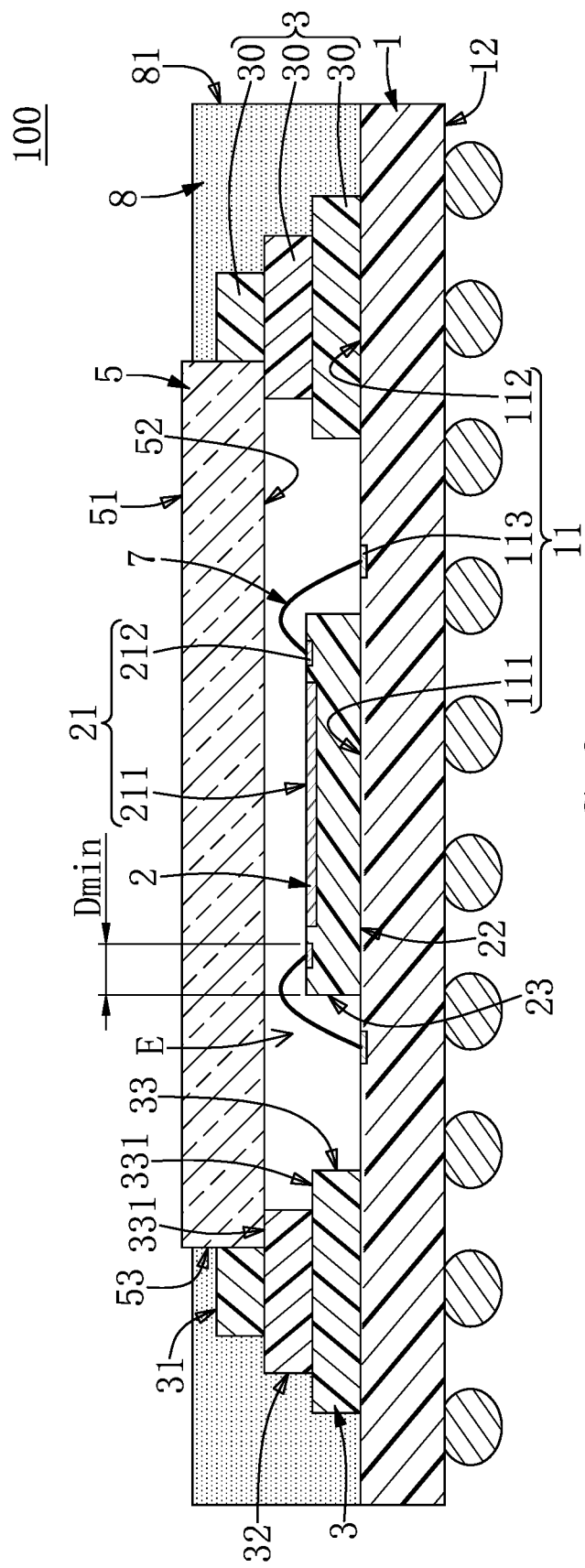
FIG. 8 is a cross-sectional view showing the sensor package structure in further another configuration according to the fourth embodiment of the present disclosure.

In addition, the second surface 52 of the light permeable member 5 is disposed on the top side 31 of the ring-shaped solder mask frame 3 (or the solder mask layers 30). The package body 8 is formed on the first board surface 11 of the substrate 1. Further, package body 8 covers and contacts the outer lateral sides of the solder mask layers 30 and at least part of the outer lateral surface 53 of the light permeable member 5, but the present disclosure is not limited thereto. For example, as shown in FIG. 8, the light permeable member 5 can be disposed adjacent to the inner lateral side of one of the solder mask layers 30 of the ring-shaped solder mask frame 3 (e.g., the step surface 331 close to the top side 31 of the ring-shaped solder mask frame 3).

In conclusion, the sensor package structure of the present disclosure is provided with the ring-shaped solder mask frame that surrounds the outer lateral side of the sensor chip. Since the thickness and the shape of the ring-shaped solder mask frame can be effectively and precisely controlled for accommodating the sensor chip or other components, the sensing region of the sensor chip is prevented from being contaminated by the ring-shaped solder mask frame, therefore effectively increasing yield rate and throughput of the manufacturing of the sensor package structure.

Specifically, the ring-shaped solder mask frame of the present disclosure can be integrally formed as a one-piece structure or can include a plurality of solder mask layers that are stacked and adhered together, so that the ring-shaped solder mask frame can fit multiple design requirements, and promoting of the sensor package structure distinct from conventional can be facilitated.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A sensor package structure, comprising:
   a plurality of metal wires;
   a substrate having a first board surface and a second board surface that is opposite to the first board surface;
   a sensor chip disposed on the first board surface and electrically coupled to the substrate through the metal wires, wherein a top surface of the sensor chip includes a sensing region, and the sensing region is spaced apart from an outer lateral side of the sensor chip by a distance less than 300 μm;
   a ring-shaped solder mask frame disposed on the first board surface of the substrate and arranged at an inner side of the metal wires, wherein the ring-shaped solder mask frame surrounds and contacts the outer lateral side of the sensor chip;
   a ring-shaped support, wherein a part of each of the metal wires is embedded in the ring-shaped support that is disposed on a top side of the ring-shaped solder mask frame and the top surface of the sensor chip; and
   a light permeable member having a first surface and a second surface that is opposite to the first surface and that is disposed on the ring-shaped support, wherein the second surface of the light permeable member, the ring-shaped support, and the sensor chip jointly define an enclosed space.

2. The sensor package structure according to claim 1, wherein the top side of the ring-shaped solder mask frame is coplanar with the top surface of the sensor chip, and the ring-shaped support is arranged outside of the sensing region.

3. The sensor package structure according to claim 1, further comprising a package body formed on the first board surface of the substrate, wherein the rest part of each of the metal wires is not embedded in the ring-shaped support but is embedded in the package body, and wherein an outer lateral side of the package body is coplanar with an outer lateral side of the substrate, and is coplanar with an outer lateral surface of the light permeable member.

4. The sensor package structure according to claim 2, wherein the substrate includes a plurality of first pads arranged on the first board surface, and the sensor chip includes a plurality of second pads arranged on the top surface and outside of the sensing region, wherein terminals at one end of the metal wires are respectively connected to the first pads, and terminals at the other end of the metal wires are respectively connected to the second pads, and wherein the part of each of the metal wires and the corresponding second pad are embedded in the ring-shaped support.

5. The sensor package structure according to claim 4, further comprising a package body formed on the first board surface of the substrate, wherein another part of each of the metal wires exposed from the ring-shaped support and the corresponding first pad are embedded in the package body.

6. The sensor package structure according to claim 5, wherein an outer lateral side of the package body is coplanar with an outer lateral side of the substrate, and is coplanar with an outer lateral surface of the light permeable member.

7. The sensor package structure according to claim 2, wherein the ring-shaped solder mask frame is integrally formed as a one-piece structure.

8. The sensor package structure according to claim 1, wherein an inner lateral side of the ring-shaped solder mask frame is gaplessly connected to an entirety of the outer lateral side of the sensor chip.

9. The sensor package structure according to claim 8, wherein the entirety of the outer lateral side of the sensor chip is arranged in a projection space defined by orthogonally projecting the ring-shaped support toward the first board surface of the substrate.

10. The sensor package structure according to claim 1, wherein the ring-shaped solder mask frame is gaplessly connected to an entirety of the outer lateral side of the sensor chip, and the top side of the ring-shaped solder mask frame is coplanar with the top surface of the sensor chip.

11. The sensor package structure according to claim 10, further comprising a package body formed on the first board surface of the substrate, wherein the ring-shaped support is arranged outside of the sensing region and is disposed on a first part of the top side of the ring-shaped solder mask frame and the top surface of the sensor chip, and the package body is connected to a second part of the top side of the ring-shaped solder mask frame and an outer lateral side of the ring-shaped solder mask frame.

12. The sensor package structure according to claim 11, wherein an area of the first part of the top side of the ring-shaped solder mask frame is less than an area of the second part of the top side of the ring-shaped solder mask frame.

13. The sensor package structure according to claim 1, wherein the ring-shaped solder mask frame is integrally formed as a one-piece structure, an inner lateral side of the ring-shaped solder mask frame surroundingly defines a space corresponding in size to the sensor chip, and the inner lateral side of the ring-shaped solder mask frame is gaplessly connected to an entirety of the outer lateral side of the sensor chip.

14. The sensor package structure according to claim 13, wherein the ring-shaped support is sandwiched between the second surface of the light permeable member and a flat surface that is formed by the top side of the ring-shaped solder mask frame and the top surface of the sensor chip.

* * * * *